(12) United States Patent
Hobro

(10) Patent No.: US 10,454,713 B2
(45) Date of Patent: Oct. 22, 2019

(54) DOMAIN DECOMPOSITION USING A MULTI-DIMENSIONAL SPACEPARTITIONING TREE

(71) Applicant: WESTERNGECO L.L.C., Houston, TX (US)

(72) Inventor: James William Douglas Hobro, Cambridge (GB)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 0 days.

(21) Appl. No.: 14/709,639

(22) Filed: May 12, 2015

(65) Prior Publication Data

US 2015/0331964 A1 Nov. 19, 2015

Related U.S. Application Data

(60) Provisional application No. 61/992,817, filed on May 13, 2014.

(51) Int. Cl.
| | |
|---|---|
| *H04L 29/08* | (2006.01) |
| *H04L 12/64* | (2006.01) |
| *H04L 12/803* | (2013.01) |
| *G06F 16/901* | (2019.01) |
| *G06F 17/50* | (2006.01) |
| *G06F 9/50* | (2006.01) |
| *G01V 99/00* | (2009.01) |

(52) U.S. Cl.
CPC ........ *H04L 12/6418* (2013.01); *G06F 9/5083* (2013.01); *G06F 16/9027* (2019.01); *G06F 17/5009* (2013.01); *H04L 47/125* (2013.01); *H04L 67/10* (2013.01); *G01V 99/005* (2013.01)

(58) Field of Classification Search
CPC .................................................. H04L 67/1038
USPC .......................................................... 709/226
See application file for complete search history.

(56) References Cited

U.S. PATENT DOCUMENTS

| | | | |
|---|---|---|---|
| 8,340,105 B2* | 12/2012 | Francini | H04L 12/4013 370/400 |
| 2010/0217574 A1* | 8/2010 | Usadi | E21B 43/12 703/10 |
| 2014/0039853 A1* | 2/2014 | Fung | E21B 49/00 703/2 |

OTHER PUBLICATIONS

Bentley, J. L., "Multidimensional Binary Search Trees Used for Associative Searching", Communications of the ACM, 1975, 18(9), pp. 509-517.

(Continued)

*Primary Examiner* — Adnan M Mirza

(57) ABSTRACT

Methods and apparatuses for domain decomposition in computer simulations using an m-dimensional space-partitioning tree. The domain decomposition may be used in load balancing. Each subdomain boundary is adjusted according to its assigned computer node capability such that its load matches its capability. The subdomain simulation load may be acquired from predictive estimates or from actual measurement during the simulation execution. The load balancing domain decomposition may be done before the simulation starts or during the simulation.

18 Claims, 6 Drawing Sheets

(56) References Cited

OTHER PUBLICATIONS

Dupros, F. et al., "Exploiting Intensive Multithreading for the Efficient Simulation of 3D Seismic Wave Propagation", 11th IEEE International Conference on Computational Science and Engineering, 2008, pp. 253-260.

Lisitsa, V. et al, "Numerical Simulation of Seismic Waves in Models with Anisotropic Formations: Coupling Virieux and Lebedev Finite-Difference Schemes", Computational Geosciences, 2012, 16, pp. 1135-1152.

\* cited by examiner

DOMAIN DECOMPOSITION USING A MULTI-DIMENSIONAL SPACEPARTITIONING TREE

BACKGROUND

This disclosure relates to the computer simulation of physical objects and their interactions. In particular, but not by way of limitation, this disclosure relates to methods of domain decomposition for load balancing such that computational tasks among available computer nodes are distributed evenly for fastest completion.

Computer simulation is essential to many new developments in science and technology. Many physical systems or objects and their interactions are simulated by computers rather than studies by physical experiments due to various considerations. For example, in nuclear weapon design and testing, nuclear device detonation is banned by international treaties. To test the function, safety or effectiveness of a nuclear device, detonations are simulated by computers. In numerical weather forecasting, by definition, the forecast has to be pronounced before the weather condition actually occurs. The progression of weather changes is simulated by numerical computer simulations. In oil and gas exploration, seismic surveys are conducted to find possible oil and gas reservoirs. The resulting seismic survey data are enormous in both quantity and complexity. To understand the data, which can reveal the interactions of seismic waves and the underlying Earth structures, computer simulations are used.

Computer simulations, parallel computing in particular, are widely used for large scale simulation of complex systems, some of which are mentioned above. For simplicity of discussion, simulation of seismic wave propagation is used as an example in the discussion below. Seismic waves can be characterized by the partial differential equations:

$$\rho \frac{\partial v_i}{\partial t} = \frac{\partial \sigma_{ij}}{\partial j} + F_i, \frac{\partial \sigma_{ij}}{\partial t} = \frac{1}{2} c_{ijkl} \left( \frac{\partial v_k}{\partial l} + \frac{\partial v_l}{\partial k} \right)$$

where indices i, j, k, l represent a component of a vector or a tensor field in Cartesian coordinates (x, y, z); $v_i$ and $\sigma_{ij}$ represent the velocity and stress field, respectively; $F_i$ denotes an external source force; p is the material density; $c_{ijkl}$ are the stiffness tensors that describe the seismic medium;

$$\frac{\partial}{\partial t}$$

represents a time derivative; and $$\frac{\partial}{\partial j}$$

represents a spatial derivative with respect to the j-th direction. A Cartesian coordinate system is used here, but other coordinate systems (e.g. polar, cylindrical or spherical coordinate systems) may be used, depending on the domain being simulated.

The wave equations are similar to many other physical systems that can be characterized by partial differential equations.

In computer simulations, the above partial differential equations are solved using finite difference methods, finite elements, spectral elements and many other methods. For simplicity, only the finite difference method is discussed below.

The finite difference method is an approach widely used in the oil and gas industry for large-scale seismic wave equation modeling in complex media. Common commercial applications include reference synthetic seismic data generation, reverse time migration and full waveform inversion. Commercial finite-difference modelers typically solve the acoustic or anisotropic pseudo-acoustic wave equation in schemes that apply a common kernel across the model domain. These schemes are usually highly optimized, and include load balancing, which is needed to account for the additional cost of absorbing boundary regions in some domains.

There are different ways to decompose a domain into subdomains such that the simulations of the subdomains can be handled by computer nodes in parallel. A computer node or a node, as used in this application, refers to a computational unit which may have one or more processors or processor cores, or even one or more computer blades. Load balancing is desirable among the nodes but not within a single node. This is because load balancing within a single node is trivial or because load balancing is not a concern. When the subdomains and the computer nodes are relatively homogenous, and the simulation load within each subdomain and the capability of each node are relatively uniform, the domain can be decomposed into uniform subdomains, each assigned to a computer node. A non-uniform decomposition may be achieved by weighting domain sizes within a regular, gridded decomposition scheme using simple heuristics.

When a system is more complicated, such as in many seismic systems where the effects of attenuation, anisotropy and elasticity are modelled in complex geological structures, the simulation can be many orders more complex than an acoustic system where the modeling requirements are homogeneous. The complexity of the system may make the load balancing more challenging for several reasons.

Firstly, there may not be enough computational capacity, even with today's supercomputer, to model an entire domain of a survey with a single unified computational scheme. Efficient or practical implementations may need a hybrid approach in which several different modeling kernels operate in different regions (or subdomains) of the model, possibly at different finite-difference grid resolutions. For example, in some parts of a survey domain, a simplified isotropic scheme with a coarse grid may be used, while in selected target volumes, an anisotropic scheme with a fine grid may be used. These regions are then coupled by applying suitable boundary conditions where they join. With this approach, the cost of finite-difference modeling varies significantly over the model domain in a manner that is difficult to account for using regular domain decomposition and heuristic predictive load balancing methods.

Secondly, computing hardware availability is leading to larger and increasingly heterogeneous cluster environments. This is partly because the pace of change in multi-core CPUs is rapid enough that clusters typically contain nodes spanning several generations of CPU technology, and also due to the emergence of mixed CPU and GPU clusters and hybrid cores. The non-uniformity of computing nodes makes load balancing more difficult to achieve.

Thirdly, the increase in the cost of seismic modeling is still outstripping the increase in available computing resources. It therefore becomes more important that finite-difference modeling jobs make the most efficient use of available cluster time.

It is desirable to find a better way to balance the computation load among available computer resources. Furthermore, it is desirable to find a way to adjust the distribution of the computation load among available computer resources if the load-balancing requirements change during the course of a computer simulation.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

This application discloses methods of domain decomposition in computer simulations. Multiple computer nodes are used to perform a simulation. A domain is divided into subdomains by an m-dimensional space-partitioning tree. Information about subdomain boundaries, neighboring subdomains, parent domains and/or child domains is stored within the tree. Each subdomain is assigned to one computer node.

In some methods, each computer node has a capability parameter. The computing load required to perform a simulation within each subdomain is estimated. If, for a subdomain, its computing load and the capability of its assigned computer node do not match, the boundaries between subdomains within the space-partitioning tree may be adjusted.

In one embodiment, the domain structure is defined using a tree-based space-partitioning decomposition of the m-dimensional model space similar to the k-dimensional tree. When the method is used dynamically, the subdomain boundaries evolve adaptively as the simulation proceeds by a series of successive adjustments that improve the load balancing at frequent intervals. This allows the system to adjust to address imbalances in load between subdomains. The same load balancing method allows the scheme to rebalance after the addition or removal of domains during the simulation. The method may be used for static load balancing before the simulation starts.

BRIEF DESCRIPTION OF DRAWINGS

Embodiments of this disclosure are described with reference to the following figures. The same numbers are used throughout the figures to reference like features and components. A better understanding of the methods or apparatuses can be had when the following detailed description of the several embodiments is considered in conjunction with the following drawings, in which.

DETAILED DESCRIPTION

Figure 1:
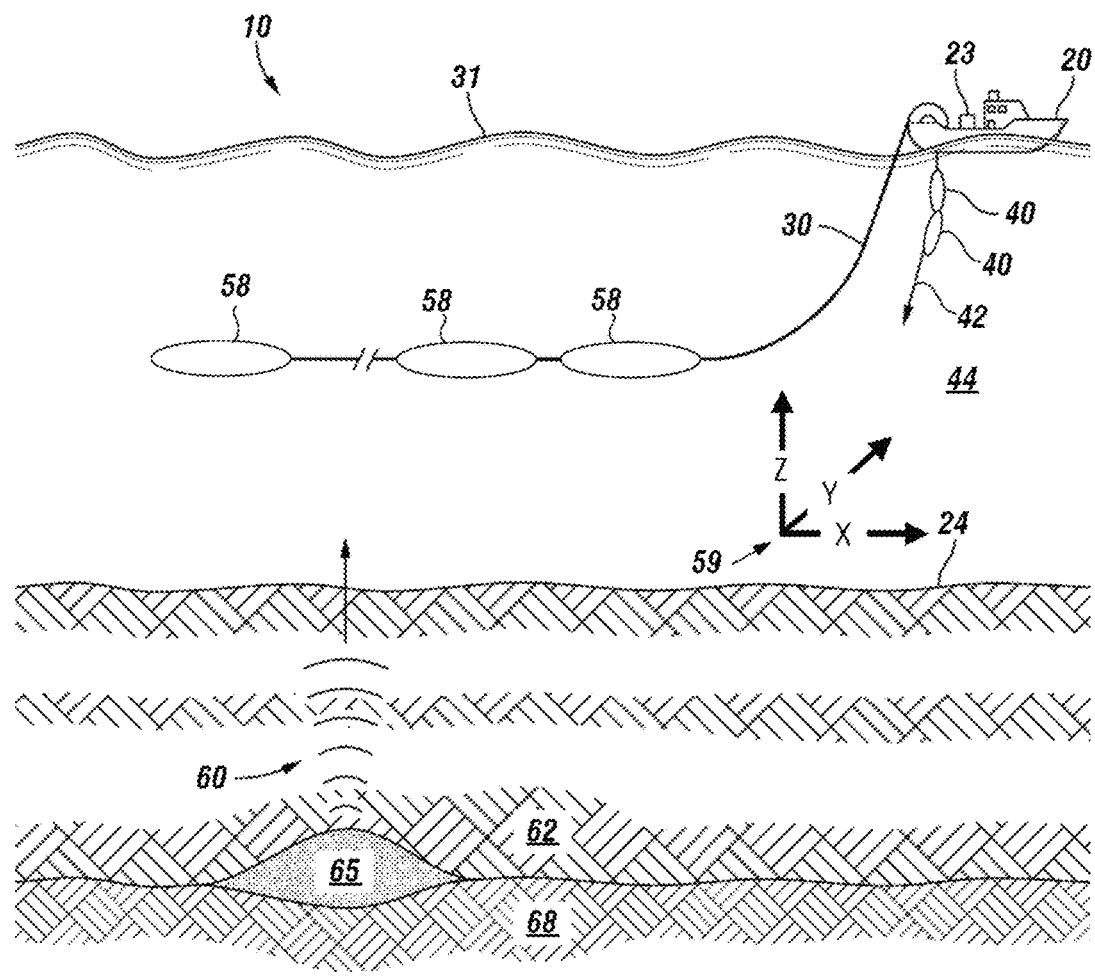
FIG. 1 illustrates a seismic acquisition system in a marine environment.

Reference will now be made in detail to embodiments, examples of which are illustrated in the accompanying drawings and figures. In the following detailed description, numerous specific details are set forth in order to provide a thorough understanding of the subject matter herein. However, it will be apparent to one of ordinary skill in the art that the subject matter may be practiced without these specific details. In other instances, well-known methods, procedures, components, and systems have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step. The first object or step, and the second object or step, are both objects or steps, respectively, but they are not to be considered the same object or step.

The terminology used in the description of the disclosure herein is for the purpose of describing particular embodiments only and is not intended to be limiting of the subject matter. As used in this description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if (a stated condition or event) is detected" may be construed to mean "upon determining" or "in response to determining" or "upon detecting (the stated condition or event)" or "in response to detecting (the stated condition or event)," depending on the context.

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The methods regarding load balancing are described for computer simulations for seismic surveys, but the methods are not limited to computer simulations for seismic surveys. Any computer simulation for 2D, 3D or higher-dimensional systems may use the methods described below.

For simplicity of discussion, seismic surveys and computer simulations of seismic surveys are described here. FIG. 1 depicts a marine-based seismic system 10. In system 10, a survey vessel 20 tows one or more seismic streamers 30 (one streamer 30 being depicted in FIG. 1) behind the vessel 20. In general, each streamer 30 includes a primary cable into which are mounted seismic sensors that record seismic signals. The streamers 30 contain seismic sensors 58, which may be hydrophones (to acquire pressure data) or multi-component sensors. For example, sensors 58 may be multi-component sensors; each sensor may be capable of detecting a pressure wavefield and at least one component of a particle motion that is associated with acoustic signals that are proximate to the sensor. Examples of particle motions include one or more components of a particle displacement, one or more components (inline (x), crossline (y) and vertical (z) components (see axes 59, for example)) of particle velocity and one or more components of particle acceleration. The system 10 includes one or more seismic sources 40 (two seismic sources 40 being depicted in FIG. 1), such as air guns and the like.

As the seismic streamers 30 are towed behind the survey vessel 20, acoustic signals 42 (an acoustic signal 42 being depicted in FIG. 1), often referred to as "shots," are produced by the seismic sources 40 and are directed down through a water column 44 into strata 62 and 68 beneath a water bottom surface 24. The acoustic signals 42 are reflected from the various subterranean geological formations, such as a formation 65 that is depicted in FIG. 1.

The incident acoustic signals 42 that are generated by the sources 40 produce corresponding reflected seismic signals 60, which are sensed by the seismic sensors 58. It is noted that the pressure waves that are received and sensed by the seismic sensors 58 include "up going" pressure waves that propagate to the sensors 58 without reflection from the air-water boundary 31, as well as "down going" pressure waves that are produced by reflections of the pressure waves 60 from an air-water boundary 31.

One goal of the seismic survey is to build up an image of a survey area for the purpose of identifying subterranean geological formations, such as the geological formation 65. Computer simulations may be used to build such an image. The seismic wave propagation through the subsurface structures, such as formation 65, is simulated by the finite difference method, or other methods.

For ease of discussion, the finite difference method is used as an example for seismic simulation, because it is widely used for large-scale seismic wave equation modeling in complex media. Commercial finite-difference modelers typically solve only the acoustic wave equation but are highly optimized. Many topics in seismology need increasingly sophisticated finite-difference modelers to account for attenuation, anisotropy and elasticity in complex geological structures. Practical finite-difference schemes designed to meet these requirements need a sophisticated domain decomposition approach to balance loads when solving heterogeneous problems. The requirement for load balancing is increased when a heterogeneous computer cluster is used. Dynamic load balancing schemes may have the potential to optimize for both these heterogeneities and to account for the varying availability of compute nodes during a simulation.

Depending on the needs, a seismic survey may be simulated as a system with multiple dimensions, for example, as a 3-D system, a 2-D system or even a 1-D system. For ease of discussion, a 2-D system is used in the following description.

Figure 2A:
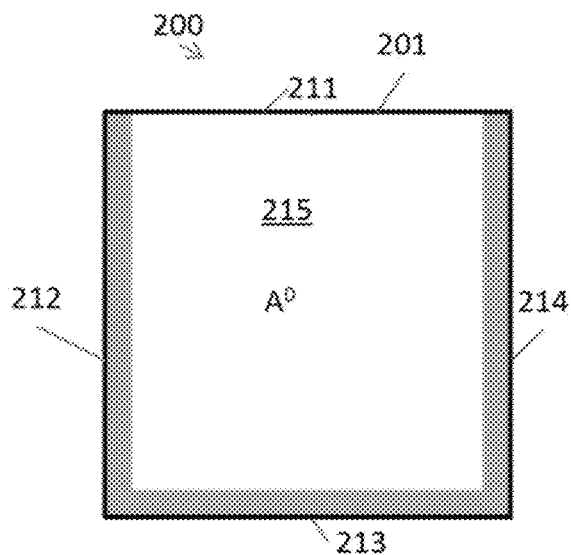
FIGS. 2a-2c illustrate an example of a simplified seismic model domain to be simulated and decomposed.

Referring to FIG. 2a, a simulation problem may be illustrated using a 2-D model 200. The problem domain 201 in two-dimensions is heterogeneous, having a central area 215 surrounded by a free surface 211 on top and three absorbing boundaries 212, 213 and 214 on the other three sides. The physical properties (e.g. velocities, densities) in the central area 215 may be heterogeneous and/or anisotropic. In terms of computer simulation time, differences in physical properties normally make no difference. So computationally, the central area may be considered homogenous.

Figure 2B:
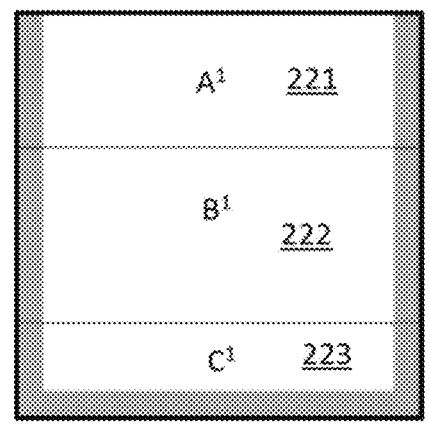
Figure 2C:
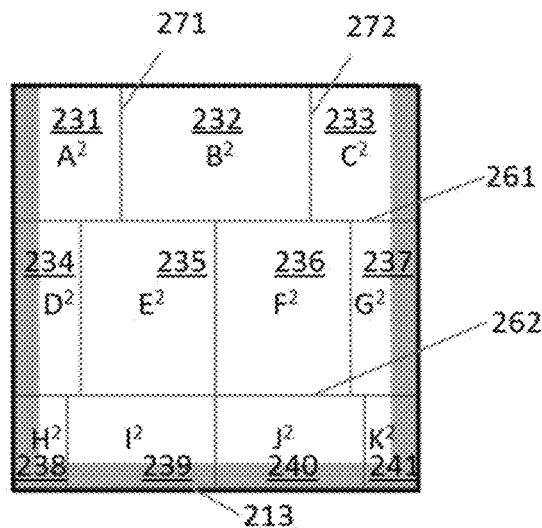

It is known that the wave propagation around absorbing boundaries (212-214) is more complex than the wave propagation through the central medium 215. Therefore, the computation of wave propagation around the boundaries (212, 213 and 214) needs more computation resources, so it is desirable that the subdomains near the boundaries are assigned with smaller areas than those in the middle of the domain, as shown in FIGS. 2b and 2c. Domain 201 is decomposed according to a space-partitioning tree, which has branch level subdomains and leaf level subdomains. A branch level subdomain is an intermediate subdomain that is a child subdomain of an upper level subdomain and has at least one child subdomain. A leaf level subdomain is a lowest level subdomain that does not have child domain. In this example, domain 201 is decomposed into three first level (branch) subdomains 221, 222 and 223 as shown in FIG. 2b. These are further decomposed into second level (leaf) subdomains 231-241 as shown in FIG. 2c.

The optimal number of levels in the tree can depend on many factors. Usually, the number of levels is similar to the number of dimensions of the system. For example, in a 3-D system, the number of subdomain levels is 3 or a similar number. In the example of system 200, there are two levels of subdomains: A0 is root domain 201, A1 221, B1 222 and C1 223 are the first level subdomains or branch subdomains. They are child domains of A0 201, and parent domains of second level subdomains A2-K2 (231-241), which are the second level subdomains and leaf subdomains. Here, the subdomains that don't contain absorbing boundaries do not need a lot of computation, so their areas are relatively large, for example, subdomains E2 235 or F2 236. The subdomains that contain absorbing boundaries, such as H2 238 and K2 241, have smaller areas.

The number of child domains for a parent domain can be arbitrary or based on other considerations. In this example, root domain 201 is decomposed into three branch domains; subdomain 221 is decomposed into three leaf domains while subdomains 231 and 241 are decomposed into four leaf domains each.

The total number of leaf subdomains is determined by the number of computer nodes. In this example, the number of computer nodes is 11. The size of each subdomain is based on the capability of the assigned computer node and the computational load of the subdomain, such that the computational load of each subdomain matches the assigned computer node. In other words, the loads of all subdomains are balanced and the simulation can be finished efficiently, without any one computer node becoming a bottleneck, making the other computer nodes wait.

The node capability can be measured or represented by various parameters depending on the simulation problem. For example, the time period for a node to complete a benchmark simulation in a standard subdomain can be a capability parameter. The shorter the time, the higher the capability. Sometimes, the standard processor's FLOPS (floating point operation per second) may be used as a parameter of capability: the higher the FLOPS, the higher the capability.

The load of a subdomain in a simulation may also be measured or represented by the time period that is needed for a benchmark processor to finish the simulation problem in the subdomain. The longer the time, the heavier the subdomain load.

The computational load of a subdomain can be either measured during the simulation or estimated based on the structures and boundary conditions of the subdomain and its neighboring domains. Similarly, the capability of a computer node may be measured during the simulation or estimated based on the node's construction and its internal structures. There are many ways to take the measurements or perform the estimation, but the details of measuring/estimating the load or capability are not relevant to this disclosure.

When each subdomain's load is commensurate with the capability of the computer node assigned to such subdomain, the load is balanced. If not, the subdomain area needs to be adjusted such that the load is increased or decreased to match the capability of the assigned node. The load for each subdomain may include costs in addition to computation, such as costs related to data exchange with neighboring subdomains.

Once the computer system is known, the number of nodes (assuming it is n) available is known and each node's capability is known, either from real-time measurement or other estimations. The problem domain can be decomposed into n subdomains, the size of which can be arbitrary initially. As shown in FIG. 2c, the domain 201 can be decomposed into 11 subdomains 231-241. Boundary 261 is a shared boundary between first level subdomains 221 and 222; and boundary 262 is a shared boundary between first level subdomains 222 and 223. Boundary 271 is a shared boundary between second level subdomains 231 and 232; boundary 272 is a shared boundary between second level subdomains 232 and 233.

Figure 3:
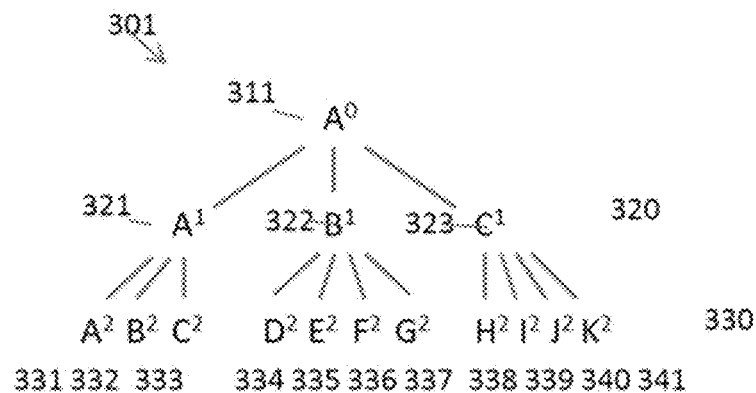
FIG. 3 illustrates a tree to decompose the domain as shown in FIG. 2c.

In the methods described in this disclosure, the domain decomposition is performed using a tree-based space-partitioning decomposition of an m-dimensional model space, such as the m-d tree as shown in FIG. 3. In this example, m is 2, or the tree is a 2-dimensional tree.

An m-d tree is a generalized k-d tree, which is a well-known tree structure for searching in computer science. Unlike a k-d tree, which is binary, in an m-d tree, a node may have more than two child nodes and the number of children need not be uniform among the parent nodes.

Dynamic Load Balancing:

Initially, domain decomposition into n subdomains may be done before load balancing is considered. Each subdomain is assigned to a node and all nodes are arranged in a tree 301, as shown in FIG. 3. Unlike regular decompositions, the number of nodes used in this scheme does not need to factorize in m dimensions. Therefore, this scheme provides a more flexible match to available cluster resources than a conventional approach.

In reference to both FIGS. 2c and 3, the domain 201 is decomposed in two levels: a first subdomain level 220s and a second subdomain level 230s. The tree 301 has two levels in additional to the root 311: branch level 320 and leaf level 330. Branches 320 contain branch nodes 321, 322 and 323. Leaves 330 contain eleven leaf nodes 331-341. Each node, from root 311, to branches 321-323, to leaves 331-341, keeps track of some information about itself, such as its boundaries, size, and internal structures, if any. Each node may also keep track of some information about its surroundings, its parent or children, and its siblings. For example, subdomain 221 (i.e. branch 321) may keep track of the boundaries of its children, which are parts of free surface 211, absorbing boundaries 212 and 214, borders 271 and 272 which separate subdomains 231, 232 and 233, and border 261, which is a shared border of subdomains 221 and 222 (branches 321 and 322). Such information about the subdomains may be stored within the m-dimensional space-partitioning tree that describes the domain and its subdomains. It is noted that not all of the information (e.g. boundaries, neighboring subdomains, parent domains, or child domains etc.) for all subdomains is necessarily stored in the m-dimensional space-partitioning tree. In some simulations, it may be convenient to store all information within the tree for some subdomains. In some simulations, it may be more efficient not to store any information for some subdomains, where such information can be derived from other subdomains. In still others, it may be more efficient to compute some information on the fly from available data rather than store it somewhere in the tree.

Figure 4:
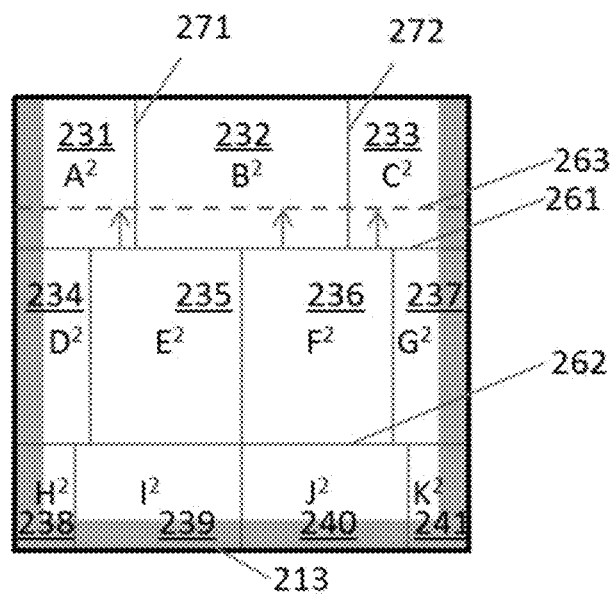
FIG. 4 illustrates a scheme to adjust the boundaries of subdomains during load rebalancing.

In a dynamic load balancing scheme, as the simulation progresses, load balancing is measured at frequent intervals and any rebalancing required is achieved by adjusting the position of the boundaries that separate neighboring subdomains. In one embodiment, within a time step, load balancing measurement and adjustment may occur after a computation phase but before a field data exchange phase. Rebalancing takes place at each rth time step, where r is chosen to optimize the stability and efficiency of the load balancing process and to allow sufficient accuracy in the time measurements used to compute the load balancing metrics. If an adjustment to the load balancing is needed, in addition to exchange of simulation results and boundary conditions, the relevant neighboring subdomains are adjusted. A portion of each subdomain is transferred to the relevant neighboring subdomains, for example, as shown in FIG. 4. This requires the transfer of model and field parameters.

As shown in FIG. 4, according to the load differences between branch nodes A1 321 and B1 322, the boundary 261 between A1 and B1 needs to be moved towards A1 by a certain amount, e.g. 1 km. In the field exchange phase, the boundary 261 is changed by that amount, becoming boundary 263. To do so, the boundary within root node A0 211 might be changed and updated, and the corresponding information made available to all child nodes in the tree. Since each node in the m-d tree has a corresponding subdomain, all necessary information is available to the subdomain.

In this example, boundary 261 needs to be moved to 263, which is the border between branch nodes 321 and 322, which are parent nodes of 331, 332, 333 and 334, 335, 336 and 337, respectively. Therefore, the boundaries of 231, 232 and 233 are moved, making these subdomains smaller by 1 km. Similarly, the boundaries of 234, 235, 236 and 237 are moved in the opposite direction, making these subdomains larger by 1 km. The model and field parameters are transferred from subdomains 231, 232 and 233 to subdomains 234, 235, 236 and 237. Once the exchanges and updates are done, the exchange phase for these subdomains is done and the simulation can proceed. The use of the m-d tree for all nodes facilitates the storage and exchange of relevant information among the nodes. This makes the search, exchange and update of relevant information among nodes more efficient.

In the example shown in FIG. 4, the borders between branch nodes (or branch level subdomains) are changed, so the borders of many subdomains are changed all at once. It is also possible and more likely that the border between two leaf nodes is changed. The domain decomposition need not be regular. Each border of a subdomain may need to exchange field information with one or more regions within borders of another subdomain. The identification and matching of these regions is performed using the domain decomposition tree as shown in FIG. 3 and discussed above.

After adjustment to the size of subdomains, all the subdomains should be sized commensurate to the capabilities of their assigned nodes. Going forward, the load should be balanced (or closer to being balanced) for all nodes, if there is no substantial change in the computing resources.

Figure 5A:
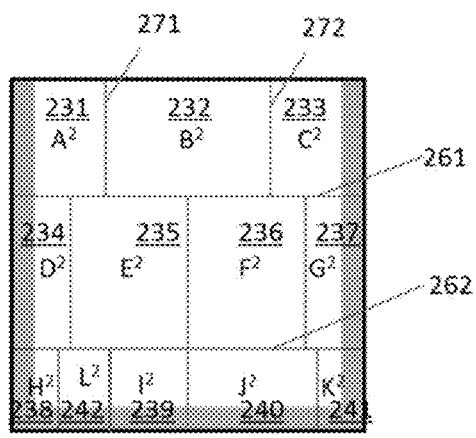
FIGS. 5a-5d illustrate a scheme to add or remove a computer node during a simulation.
Figure 5B:
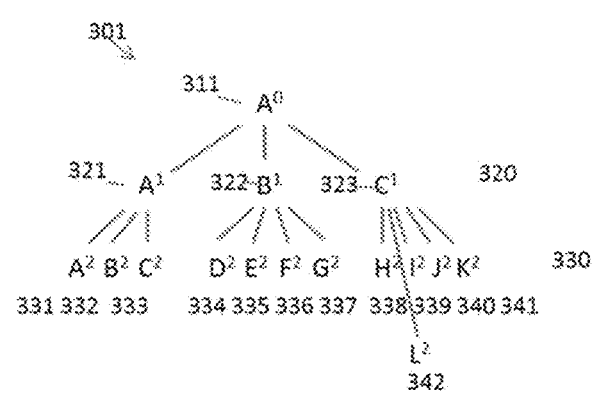

The use of the m-d tree in domain decomposition makes it easy to dynamically rebalance loads during a simulation. If computing resources are changed during a simulation, for example, if the number of compute nodes changes, the dynamic scheme will make real-time adjustment soon after the change. For example, if one or more additional compute nodes become available for the simulation, leaf nodes within the tree will be divided, creating new leaf nodes representing smaller domains. One or more subdomains may be divided simply (e.g. in half) with the field variables and model parameters for one portion transferred to the new node as shown in FIGS. 5a and 5b. In this example, a new computer node 342 becomes available. The subdomain 239 is split into two subdomains: 239 and 242. These two subdomains each inherit half of the original subdomain 239. The new domain decomposition is shown in FIG. 5a and the new tree is shown in FIG. 5b. The load is not balanced after the split but the load rebalancing mechanism will then allow the simulation to rebalance in subsequent time steps. No further change to the domain decomposition or load balancing scheme is needed.

Figure 5C:
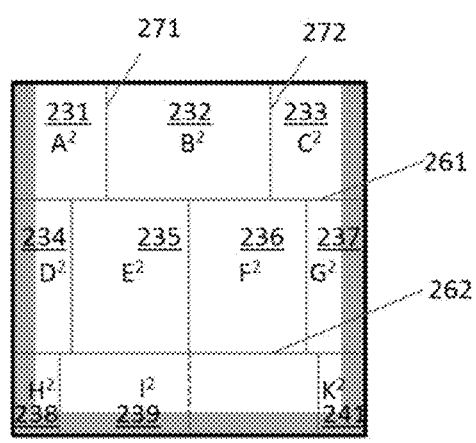
Figure 5D:
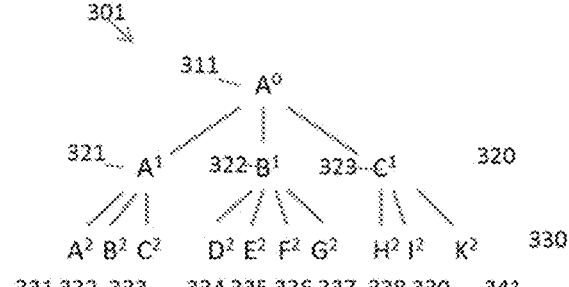

The removal of one or more compute nodes is dealt with in a similar manner. For example, as shown in FIGS. 5c and 5d, when a node 240 is removed, neighboring leaf nodes 239 and 240 are merged and the field and model state is transferred to the remaining compute node 239. The border between subdomain 239 and 240 is removed. Boundaries of subdomain 240 become part of boundaries of subdomain 239. The simulation is then allowed to rebalance as described above.

In some situations, one or more boundaries between groups or subdomains in a tree may be fixed, or needed to move within given constraints. This can be used to fix the location of a change in a kernel type or grid resolution, either precisely or within given bounds. For example, some regions may use kernels that account for anisotropy and elastic effects; others may use kernels that account for attenuation effects.

Still referring to FIG. 4, the boundaries between subdomains may be of any shape. In some embodiments when a Cartesian coordinate system is used, the boundaries may be maintained straight, such that each sub domains is rectangular. The boundaries are maintained as straight lines during all subdomain adjustment. It is more convenient and can reduce computational load and modeling complexity. When a non-Cartesian coordinate system is used to decompose a domain, the subdomains need not be rectangular.

Figure 6:
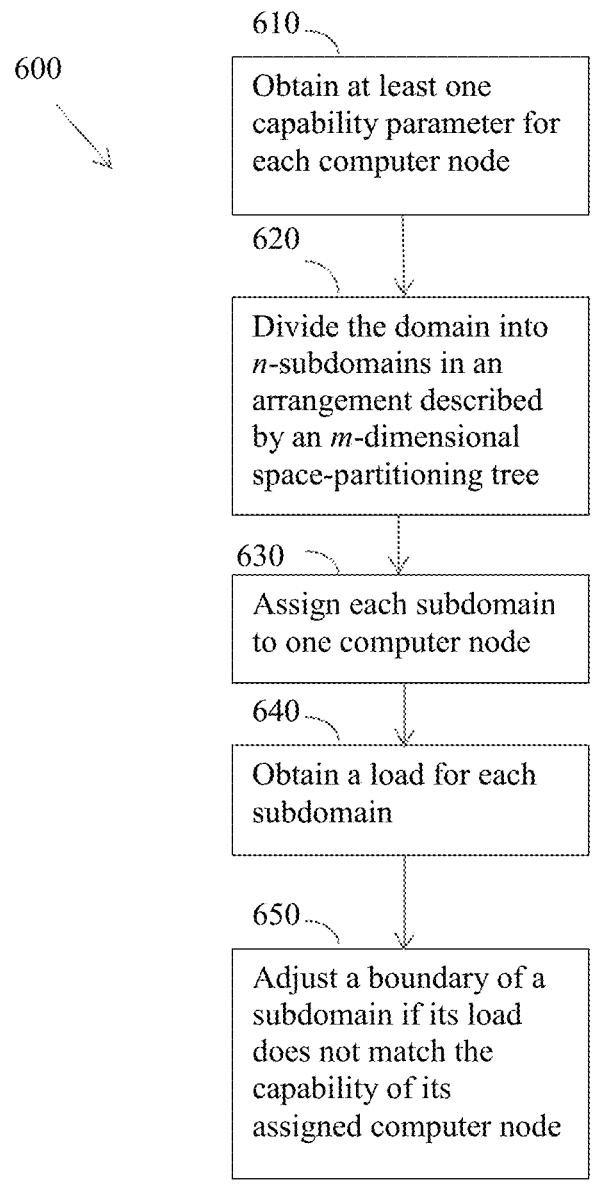
FIG. 6 illustrates a process flow diagram of a domain decomposition method.

Referring to FIG. 6, the domain decomposition method 600 can be summarized in a flow diagram. The computer simulation kernel of the domain is defined and the relevant information or parameters of all available n computer nodes are collected.

In step 610, obtain at least one capability parameter of each computer node;

In step 620, divide the domain into n-subdomains in an arrangement described by an m-dimensional space-partitioning tree, wherein n is the number of computer nodes and information about boundaries, neighboring subdomains, parent domains and/or child domains is stored within the tree;

In step 630, assign each subdomain to one computer node;

In step 640, obtain a load for each of the n subdomains;

In step 650, adjust a boundary of a subdomain if its load does not match the capability of its assigned computer node. If the capability of the assigned computer node is larger than the subdomain load, then the boundary is moved outwards to increase the subdomain area. Its neighboring subdomain who shares the boundary will have its area reduced by the same amount. Similarly, if the capability of the assigned computer node is smaller than the subdomain load, then its boundary is moved inwards to decrease the subdomain area.

Its neighboring subdomain who shares the boundary will have its area increased by the same amount.

Step 650 may be repeated for all nodes, or multiple adjustments combined in an optimization process, until the load matches the capability of the assigned node for each node.

It is possible to decompose a domain into subdomains with balanced loads for most of the nodes. In that case, adjustment of boundaries is not needed. The tree structure provides a convenient way to keep track of relevant information about the decomposition. The domain decomposition using the tree structure can be used independent of load balancing, e.g. only steps 620 and 630 are needed.

In many other cases, the load balancing is achieved through several iterations of adjustments of many subdomains. In those cases, step 640 of obtaining loads for changed subdomains and step 650 subdomain adjustments may be repeated several times in an iterative process.

As mentioned above, there are many parameters that can be selected to be a capability for a computer node. Similarly, there are several parameters that can be selected to be the load of a subdomain in a simulation. Subdomains and their corresponding computer nodes are arranged in an m-dimensional tree, which facilitate the information storage and exchange among the nodes.

Static Balancing

In some simulation situations, the computing resources are well-known and fixed or do not change significantly over time. The variation of load during the simulation may therefore be negligible. In such a situation, the above dynamic load balancing scheme may be replaced with a static load balancing scheme. Since the computing resources are fixed, the number of computer nodes and their capability for each node are known.

The domain can be decomposed into the number of subdomains corresponding to the computer nodes, using the m-dimensional tree. All relevant information related to a subdomain and its node is kept with the tree. For each subdomain, its load may be estimated with known boundaries, domain model, its parent node, child nodes and neighboring nodes. For this estimation, its size, boundaries, parent, children and neighbor relationship can be modified. The modification and adjustment may be done for all subdomains until the load is balanced. All the estimations, adjustment etc. are performed before the actual simulation. When the simulation starts, the load has been balanced for each node and does not change during the simulation.

The methods for static balancing are similar to those of the dynamic balancing discussed above. The main difference is that in a static balancing, the computer capability or the subdomain load is not measured in real-time during a simulation. They are estimated by various methods, from past experience, empirical data, or theoretical analysis, etc. In dynamic balancing, while the simulation is on-going, the actual node capability or subdomain load may be measured in real-time. There is a cost associated with such measurements, which may divert computing resources.

When a static load balancing scheme is used, there is no overhead associated with the load measuring and load rebalancing. Therefore, in some situations, the simulation is more efficient.

Static balancing and dynamic balancing may be combined in the same simulation. The static balancing method is used before the start of a simulation, such that the initial domain decomposition is already in a roughly balanced state. This provides the dynamic balancing scheme with a good starting point. During the simulation, the actual node capability and subdomain load are measured. These measurements are used to refine the load balancing. Because the starting point is already roughly balanced, the dynamic balancing only needs to make minor adjustments, which minimizes the cost associated with balancing. The combination of static and dynamic balancing may increase the efficiency of a simulation. The result of the simulation, e.g. a seismic image or a wavefield image may be obtained quickly.

Although most examples discussed above are related to seismic simulation, the methods discussed are not limited to seismic simulation. The methods may be used in any computer simulation where domain decomposition and load balancing are needed. The simulated physical system or phenomena can be anything that can be characterized by partial differential equations, such as acoustic wave propagation, elastic wave propagation, heat or mass transportation etc. If the simulation is to test the safety and effectiveness of an explosive device, the result of a simulation may be the approval and construction of that explosive device. If the simulation is for numerical weather forecast, the result may be a weather forecast.

As those with skill in the art will understand, one or more of the steps of methods discussed above may be combined and/or the order of some operations may be changed. Further, some operations in methods may be combined with aspects of other example embodiments disclosed herein, and/or the order of some operations may be changed. The process of measurement, its interpretation, and actions taken by operators may be done in an iterative fashion; this concept is applicable to the methods discussed herein. Finally, portions of methods may be performed by any suitable techniques, including on an automated or semi-automated basis such as on computing system 700 in FIG. 7.

Figure 7:
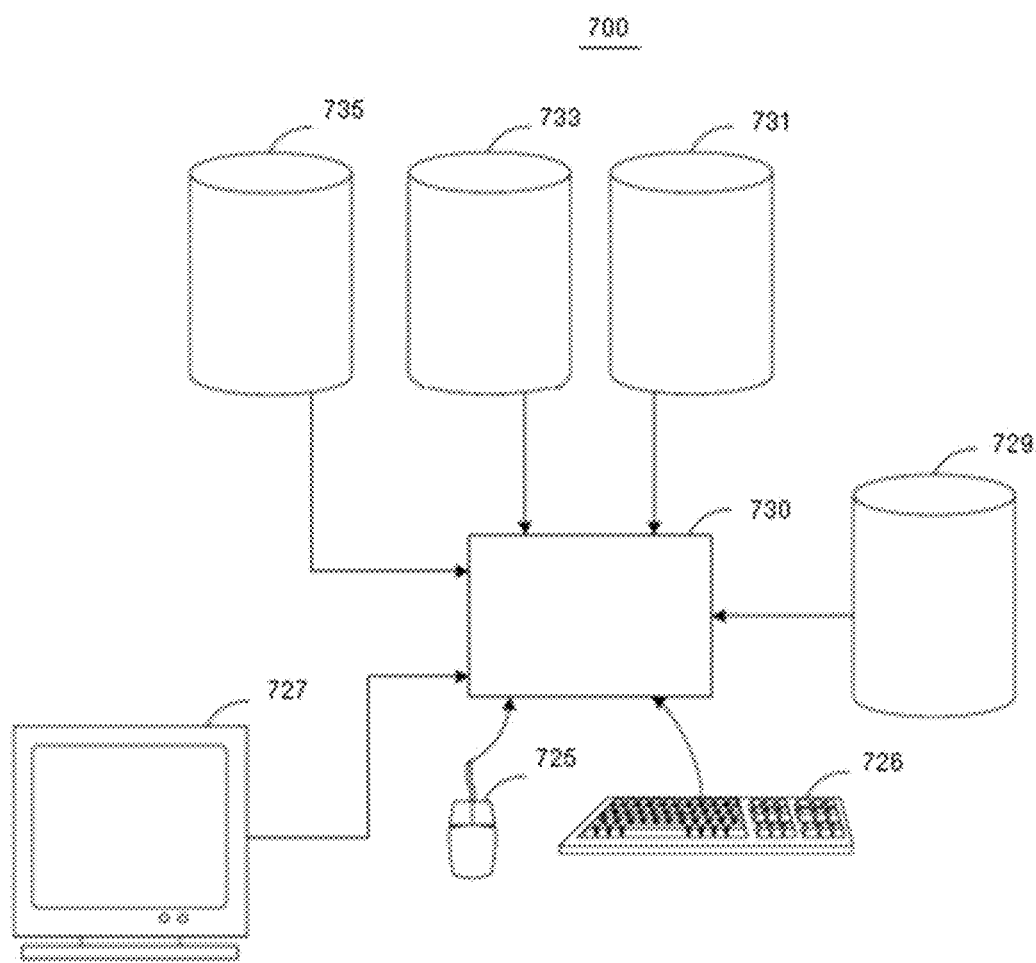
FIG. 7 illustrates a schematic view of a computer system for implementing methods in accordance with an embodiment of the present invention.

Portions of methods described above may be implemented in a computer system 700, one of which is shown in FIG. 7. For simplicity, only one computer 730 is shown, while system 700 may have multiple computers. The system computer 730 may be in communication with disk storage devices 729, 731, 733 and 735, which may be external hard disk storage devices. It is contemplated that disk storage devices 729, 731, 733 and 735 are conventional hard disk drives, and as such, may be implemented by way of a local area network or by remote access. While disk storage devices are illustrated as separate devices, a single disk storage device may be used to store any and all of the program instructions, measurement data, and results as desired.

In one implementation, real-time data from the sensors may be stored in disk storage device 731. Various non-real-time data from different sources may be stored in disk storage device 733. The system computer 730 may retrieve the appropriate data from the disk storage devices 731 or 733 to process data according to program instructions that correspond to implementations of various techniques described herein. The program instructions may be written in a computer programming language, such as C++, Java and the like. The program instructions may be stored in a computer-readable medium, such as program disk storage device 735. Such computer-readable media may include computer storage media. Computer storage media may include volatile and non-volatile media, and removable and non-removable media implemented in any method or technology for storage of information, such as computer-readable instructions, data structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the system computer 730. Combinations of any of the above may also be included within the scope of computer readable media.

In one implementation, the system computer 730 may present output primarily onto graphics display 727, or via printer 728 (not shown). The system computer 730 may store the results of the methods described above on disk storage 729, for later use and further analysis. The keyboard 726 and the pointing device (e.g., a mouse, trackball, or the like) 725 may be provided with the system computer 730 to enable interactive operation.

The system computer 730 may be located on-site or at a data center remote from the field. The computer system 730 may be connected with other systems via network link 724 (not shown). The system computer 730 may be in communication with equipment on site to receive data of various measurements. Such data, after conventional formatting and other initial processing, may be stored by the system computer 730 as digital data in the disk storage 731 or 733 for subsequent retrieval and processing in the manner described above.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

The invention claimed is:

1. A method of domain decomposition in a computer simulation of a domain across multiple (n) computer nodes, the method comprising:
   a) dividing the domain into n-subdomains in an arrangement described by an m-dimensional space-partitioning tree,
   wherein n is the number of computer nodes and m is the number of dimensions of the domain,
   wherein the m-dimensional space-partitioning tree comprises a root domain and at least two levels of subdomains, and
   wherein information of boundaries, neighboring subdomains, parent domains, or child domains, or some of their combinations, is stored within the tree; and
   b) assigning each subdomain to one computer node.

2. The method of claim 1, when applied to load balancing in a computer simulation with n computer nodes, the method further comprising:
   c) having at least one capability parameter for each computer node;
   d) estimating a computing load for each of the n-subdomains; and
   e) adjusting the subdomain boundaries to match each estimated subdomain computing load to the capability of its assigned computer node.

3. The method of claim 1, wherein the domain is:
   a two-dimensional domain having two space dimensions; or
   a three-dimensional domain having three space dimensions.

4. The method of claim 2, further comprising:
   performing load balancing of the domain decomposition in advance of a computer simulation.

5. The method of claim 2, further comprising:
   performing the computer simulation for r-time steps;
   measuring the load at each computer node; and
   adjusting the subdomain boundaries to improve the match of each estimated subdomain computing load to the capability of its assigned computer node if the system is not balanced.

6. The method of claim 1, wherein subdomain boundaries are parallel or perpendicular to an axis in a Cartesian coordinate system.

7. The method of claim 1,
   wherein at least one subdomain boundary is fixed.

8. The method of claim 2, wherein the computer load for a subdomain is the computation time that it takes to finish the simulation of the subdomain.

9. The method of claim 2, further comprising:
   performing the simulation on each computer node; and
   producing a simulation report.

10. The method of claim 9, wherein the report comprises a seismic image, a wavefield image, a weather forecast, or a safety report of an explosive device.

11. The method of claim 1, wherein the information stored within the tree comprises information of subdomain boundaries, neighboring subdomains, parent domains and child domains.

12. The method of claim 1, wherein the information stored within the tree does not include information of boundaries, neighboring subdomains and child domains for at least one subdomain.

13. A computer processing system for computer simulation of a domain with multiple (n) computer nodes, wherein the domain is decomposed into subdomains, the system comprising:
   multiple computer nodes; and
   computer readable storage containing computer executable instructions which when executed by the computer nodes, cause the computer nodes to:
   a) divide the domain into n-subdomains in an arrangement described by an m-dimensional space-partitioning tree,
      wherein n is the number of computer nodes and m is the number of dimensions of the domain,
      wherein the m-dimensional space-partitioning tree comprises a root domain and at least two levels of subdomains, and
      wherein information about boundaries, neighboring subdomains, parent domains and child domains is stored within the tree; and
   b) assign each subdomain to one computer node.

14. The system of claim 13, wherein the computer readable storage further contains computer executable instructions which when executed by computer nodes, cause the computer nodes to load-balance computer simulation with the n computer nodes using a method, wherein the method comprises:
- a) having at least one capability parameter for each computer node;
- b) estimating a computing load for each of the n-subdomains; and
- c) adjusting the subdomain boundaries to match each estimated subdomain computing load to the capability of its assigned computer node.

15. The system of claim 13, wherein the domain is:

a two-dimensional domain having two space dimensions; or a three-dimensional domain having three space dimensions.

16. The system of claim 14, wherein the method further comprises:

performing load balancing of the domain decomposition in advance of the computer simulation.

17. The system of claim 14, wherein the method further comprises:

performing the computer simulation for r-time steps;

measuring the load at each computer node; and adjusting the subdomain boundaries to improve the match of each estimated subdomain computing load to the capability of its assigned computer node if the system is not balanced.

18. The system of claim 13, wherein subdomain boundaries are parallel or perpendicular to an axis in a Cartesian coordinate system.

* * * * *